(12) United States Patent
Weijers et al.

(10) Patent No.: US 11,898,707 B2
(45) Date of Patent: Feb. 13, 2024

(54) LIGHT-EMITTING DIODE FILAMENT COMPRISING THREE TYPES OF LEDS

(71) Applicant: SIGNIFY HOLDING B.V., Eindhoven (NL)

(72) Inventors: Aldegonda Lucia Weijers, Eindhoven (NL); Vincent Arnoud Wouters, Helmond (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 87 days.

(21) Appl. No.: 17/774,525

(22) PCT Filed: Nov. 3, 2020

(86) PCT No.: PCT/EP2020/080722
§ 371 (c)(1),
(2) Date: May 5, 2022

(87) PCT Pub. No.: WO2021/089493
PCT Pub. Date: May 14, 2021

(65) Prior Publication Data
US 2022/0390073 A1  Dec. 8, 2022

(30) Foreign Application Priority Data
Nov. 7, 2019 (EP) .................................... 19207722

(51) Int. Cl.
*F21K 9/232* (2016.01)
*F21Y 103/10* (2016.01)
*F21Y 113/10* (2016.01)
*F21Y 115/10* (2016.01)

(52) U.S. Cl.
CPC ........... *F21K 9/232* (2016.08); *F21Y 2103/10* (2016.08); *F21Y 2113/10* (2016.08); *F21Y 2115/10* (2016.08)

(58) Field of Classification Search
CPC .. F21K 9/232; F21Y 2103/10; F21Y 2113/10; F21Y 2115/10
USPC ..................................................... 362/217.01
See application file for complete search history.

(56) References Cited

U.S. PATENT DOCUMENTS

2017/0241598 A1* 8/2017 Jiang ....................... H01L 24/48
2018/0216787 A1* 8/2018 Chung .................... H01L 33/56

* cited by examiner

*Primary Examiner* — Andrew J Coughlin
*Assistant Examiner* — Hana S Featherly (57) ABSTRACT

The present disclosure relates to a light-emitting diode (LED) filament (100) comprising a carrier (120) having a first side on which a plurality of LEDs is arranged. The plurality of LEDs comprises a LED of a first type (111) arranged to emit light having a first peak wavelength in the range 400-500 nm, a LED of a second type (112) arranged to emit light having a second peak wavelength in the range 500-570 nm, and a LED of a third type (113) arranged to emit light having a third peak wavelength in the range 590-680 nm. An encapsulant (130) encapsulates at least the LED of the first type, and at least partly the LEDs of the second type and the third type. The encapsulant (130) comprises a wavelength converting material having a higher absorption coefficient for the first peak wavelength than for the second peak wavelength and the third peak wavelength. The wavelength converting material has an emission band extending at least from 500 to 650 nm.

14 Claims, 5 Drawing Sheets

LIGHT-EMITTING DIODE FILAMENT COMPRISING THREE TYPES OF LEDS

CROSS-REFERENCE TO PRIOR APPLICATIONS

This application is the U.S. National Phase application under 35 U.S.C. § 371 of International Application No. PCT/EP2020/080722, filed on Nov. 3, 2020, which claims the benefit of European Patent Application No. 19207722.0, filed on Nov. 7, 2019. These applications are hereby incorporated by reference herein.

TECHNICAL FIELD

The present disclosure relates generally to the field of solid state lighting. Specifically, it relates to a color temperature tunable light-emitting diode (LED) filament and lighting device thereof.

BACKGROUND

Incandescent lamps are rapidly being replaced by light-emitting diode (LED) based lighting solutions. Solid state lighting devices may provide many advantages over their incandescent, fluorescent, and gas-discharge based counterparts. For instance, they may provide increased operational life, reduced power consumption and higher efficacy. Solid state lighting devices, such as LEDs, are employed in a wide range of lighting applications including general lighting.

LED-based lighting has been developed as retrofit lamps to provide a look and light similar to that of an incandescent bulb. However, further development is required in order to provide improved and more decorative LED-based lighting devices.

SUMMARY

One general aim of the present disclosure is to provide color controllable LED filament lamps. Specifically, there is a desire to be able to control the color temperature of white light LED filament lamps.

It is therefore an object of the present invention to meet at least some of the above mentioned goals, and to provide an improved tunable LED filament.

This and other objects are achieved by means of a LED filament as defined in the appended independent claim. Other embodiments are defined by the dependent claims.

According to a first aspect of the present disclosure, a light-emitting diode (LED) filament is provided. The LED filament comprises a carrier, a plurality of LEDs and an encapsulant. The plurality of LEDs is arranged on a first side of the carrier. The plurality of LEDs comprises at least one LED of a first type, at least one LED of a second type, and at least one LED of a third type. LEDs of the first type are adapted to emit light having a first peak wavelength in the range 400-500 nm. LEDs of the second type are adapted to emit light having a second peak wavelength in the range 500-570 nm. LEDs of the third type are adapted to emit light having a third peak wavelength in the range 590-680 nm. The encapsulant encapsulates the at least one LED of the first type. Further, the encapsulant at least partly encapsulates the at least one LED of the second type and the at least one LED of the third type. The encapsulant comprises a wavelength converting material which has a higher absorption coefficient for the first peak wavelength than for the second peak wavelength and the third peak wavelength. The wavelength converting material has an emission band extending at least between 500 and 650 nm.

Depending on the intensity of the different light sources (i.e. the LEDs of the different types), the LED filament may emit light of different colors. Specifically, the LEDs of the first type may together with the wavelength converting material provide a cool white light. Increasing the intensity of the LEDs of the second type and the LEDs of the third type may result in the white light becoming warmer. Thus, depending on (among other things) the powering of the LEDs, a LED filament in accordance with this disclosure may provide different types of white light, such as white light with different tones/temperatures.

In the following, LEDs of the first type may also be referred to as blue LEDs, LEDs of the second type may be referred to as green LEDs, and LEDs of the third type may be referred to as red LEDs. Light emitted by LEDs may be referred to as LED light. Light emitted by the first type of LED may be referred to as blue LED light, light emitted by the second type of LED may be referred to as green LED light, and light emitted by the third type of LED may be referred to as red LED light.

The wavelength converting material may be adapted to absorb light within a first wavelength range (absorption band) and emit light in a different wavelength range (emission band). This process may be referred to as light conversion or converting the light. Light emitted by the wavelength converting material may be referred to as converted light.

The wavelength converting material has a higher absorption coefficient for the first peak wavelength than for the second peak wavelength and the third peak wavelength. Thus, a larger portion of the blue LED light may be absorbed by the wavelength converting material and re-emitted with a different wavelength. The green LED light and the red LED light may be converted to a lower extent. For non-converted light, the encapsulant may act as a scattering material which may improve the color mixing of the light emitted by the different LEDs. In other words, the encapsulant may refract and redirect the light emitted by the LEDs of all types and wavelengths, which may increase the uniformity of the light emitted by the LED filament.

The various embodiments of the present disclosure provide the possibility to combine light of different wavelengths at different rates of emission to change the correlated color temperature of the combined light (or combined LED filament light). Specifically, light emitted by the LED filament, also referred to as LED filament light, may comprise a combination of (at least some of) the following types of light:

light emitted by the at least one LED of the first type (non-converted blue light, direct blue light);

light emitted by the at least one LED of the second type (non-converted green light, direct green light);

light emitted by the at least one LED of the third type (non-converted red light, direct red light);

light emitted by the at least one LED of the first type, absorbed by the wavelength converting material, and re-emitted as light with a different wavelength (converted blue light);

light emitted by the at least one LED of the second type, absorbed by the wavelength converting material, and re-emitted as light with a different wavelength (converted green light);

light emitted by the at least one LED of the third type, absorbed by the wavelength converting material, and re-emitted as light with a different wavelength (converted red light).

It is noted that converted green light and converted red light will contribute to a very little extent to the light emitted by the LED filament.

Whiteness of light sources is often described in relation to ideal black body radiators. When the temperature of an ideal black body increases, the body starts glowing (emitting light). For relatively low temperatures, red light is emitted. As the temperature increases further, the emitted light turns yellow, and finally, for very high temperatures, the emitted light becomes white. The correlated color temperature (CCT) of a light source is the temperature (expressed in kelvin) of an ideal black body radiator showing the most similar color. The black body line, or black body locus (BBL) is the path that such a black body would take in a particular chromaticity space as its temperature changes. In other words, the BBL includes or describes the different colors an ideal black body would emit for different temperatures.

In a sense, the everyday notion of color temperature is opposite to the CCT scale. Usually, a redder light is described to be warm, while a white-blue light is described as cold. In the CCT scale, a red (warm) light corresponds to a lower (colder) temperature, while a white-blue (cold) light corresponds to a higher (warmer) temperature.

Many prior art color controllable LED-based lighting solutions try to approximate the color of a black body using two different light sources: either two different LED filaments or two different LED strings on a same filament. However, as the BBL is curved, the range in which a straight line may approximate the BBL is rather narrow. In order to provide light which can be varied along the BBL in a wider range, light of three different sources (three primaries) is required.

In the present LED filament, LEDs of three different colors are employed (blue, green, and red). However, as the LEDs of the first type (the blue LEDs) are covered by an encapsulant which is adapted to absorb light from the blue LEDs and emit light within an emission band at least including the wavelengths 500-650 nm, a portion of the light emitted by the blue LEDs may be converted such that the combination of unconverted and converted light is perceived as cool white light. The present LED filament may thus be described as using the primaries white, red, and green. It will be appreciated that the wavelength converting material may also emit light of other wavelengths.

Several factors can be used to alter the ratio of emission of the up to six different light components, and thus the CCT of the LED filament light. For example, the number of LEDs of the three different types may be varied. The wavelength converting material may be altered. The powering may be different between LEDs of one type and LEDs of another type. More specific examples will be described in relation to different embodiments defined below.

According to some embodiments, the LED filament may be adapted to emit light with at least a first correlated color temperature (CCT) based only on light emitted by the at least one LED of the first type. The LED filament may further be adapted to emit light with at least a second CCT based on light emitted by the at least one LED of the first type, the at least one LED of the second type and the at least one LED of the third type. A difference between the first CCT and the second CCT may be in the range 3000-5300 K.

In other words, the LED filament may be configured such that if only the LEDs of the first type (blue LEDs) are powered (supplied with current, turned on), the LED filament may emit white light of the first CCT. Adding light from the LEDs of the second (green) and third (red) type, the LED filament may emit white light of a second CCT. Specifically, the first CCT may be higher than the second CCT. It will be appreciated that the LED filament may be controlled to emit light with a CCT in the range between the first CCT and the second CCT. For example, the LED filament may be controlled to emit light with a CCT which may be varied at least in the range between the first CCT and the second CCT.

A large difference between the first CCT and the second CCT may provide a large range in which the color temperature may be altered or controlled. A wide CCT range may allow a user to adapt the light of the LED filament to fit different applications and atmospheres. Different activities require different light, and therefore different temperatures of light. For example, a light with a high CCT (cool white light) may be suitable for activities which require a high visibility of objects and details, such as reading or cleaning. A light with a lower CCT may be perceived as more comfortable and cozy, and may thus be more suitable for social settings.

According to some embodiments, the first CCT may be in the range 4000-7000 K.

White light in the range 4000-7000 K may provide a high visibility of objects. Thus, such a light may be suitable for example for reading.

According to some embodiments, light emitted by LEDs of the second type and by LEDs of the third type may correspond to wavelengths being outside or at the fringes of an absorption band of the wavelength converting material. The wavelength converting material may be adapted to absorb light emitted by LEDs of the first type within the absorption band.

In other words, light emitted by the LEDs of the second type and the third type may be mostly transmitted through the encapsulant, without being converted (or at least to a very little extent).

According to some embodiments, the plurality of LEDs may be arranged in one row on the first side of the carrier.

Embodiments in which all LEDs are arranged in one row (or in a single file) on the carrier may allow for a reduced width of the LED filament. A slimmer LED filament may facilitate the arrangement of the LED filament inside a lighting device, such as a bulb. Furthermore, a slimmer LED filament may provide a more pleasant, elegant appearance. According to some embodiments, in the row, every third LED may be a LED of the first type, every third LED may be a LED of the second type and every third LED may be a LED of the third type.

Alternating the LEDs in the row may lead to a more even arrangement of the LEDs along the carrier. Arranging the LEDs in an alternate manner may thus improve the mixing of the light of different wavelengths emitted by the different types of LEDs, which may in turn improve the uniformity of the light.

According to some embodiments, the LEDs may be arranged in groups of three in the row. A LED spacing (or pitch) between LEDs within each group may be shorter than a group spacing (or pitch) between two successive groups.

Arranging the LEDs more tightly in groups may further improve the mixing of the light. A larger distance between the groups may improve thermal management of the LED filament.

According to some embodiments, the plurality of LEDs may be arranged in groups of three. Each group may comprise one LED of said at least one LED of the first type, one LED of said at least one LED of the second type, and one LED of said at least one LED of the third type. The LED of the second type and the LED of the third type may be arranged at a substantially same position along the elongation of the carrier. The LED of the second type may, for example, be arranged next to the LED of the third type, such that they are aligned along a direction substantially orthogonal to the elongation of the carrier. For example, the LED of the second type may be arranged on a first side of an imagined line dividing the first side of the carrier lengthwise (i.e. along the direction of elongation) in two parts, and the LED of the third type may be arranged on the opposite side of such a line.

The LED of the first type may be arranged at a different position along the elongation of the carrier next to the position of the LED of the second type and the LED of the third type. The LEDs of the first type of each group may be aligned along the elongation of the carrier.

This arrangement of LEDs may provide that the LEDs of different types may be arranged even more closely together. Arranging the LEDs more closely together may further increase the color mixing, and thus the uniformity of the LED filament light.

Alternatively, the LEDs may be arranged in a similar, closely grouped manner, wherein the positions of the LEDs of the different types within the group may be switched. For example, the LEDs may be arranged in a similar close group as described above where the position of the LED of the first type may be switched with the position of the LED of the second type or with the position of the LED of the third type.

According to some embodiments, the LEDs of the second type of each group may be aligned along the elongation of the carrier. The LEDs of the third type of each group may also be aligned along the elongation of the carrier.

According to some embodiments, the encapsulant may be arranged in one line which covers the LEDs of the first type and partially covers the LEDs of the second type and the LEDs of the third type.

Embodiments in which the LEDs of the second and the third type are only partially covered by the encapsulant comprising the wavelength converting material may provide increased efficiency for warmer light (i.e. with lower CCT) as less light is scattered.

According to some embodiments, the encapsulant may be arranged in one line covering the LEDs of the first type, the LEDs of the second type, and the LEDs of the third type.

Embodiments in which the encapsulant comprising wavelength converting material entirely covers the LEDs of the second type and the LEDs of the third type may provide increased color mixing, as light from all three types of LEDs is scattered, and thus a more homogeneous (uniform) light may be achieved.

According to some embodiments, the plurality of LEDs may comprise more LEDs of the first type than LEDs of the second type and LEDs of the third type.

Alternatively, the plurality of LEDs may comprise more LEDs of the third type than LEDs of the first type or LEDs of the second type, or the plurality of LEDs may comprise more LEDs of the second type than LEDs of the first type or LEDs of the third type.

To provide a certain CCT range, there may be a need for a larger number of LEDs of one type than LEDs of the other types. Decreasing the number of LEDs of the types of LEDs from which less intensity is required may thus increase efficiency of the LED filament. For example, if a LED filament providing a warmer CCT range is desired, the number of LEDs of the second and/or third type may be increased. Alternatively, if a LED filament providing a cooler CCT range is desired, the number of LEDs of the first type may be increased.

It will be appreciated that in some embodiments, the number of LEDs of the different types (i.e. the number of LEDs of the first type, the number of LEDs of the second type and the number of LEDs of the third type) may vary depending on the application. However, there is a relationship between the number of LEDs of the different types and the overall color point of the LED filament. Selection of the LEDs may thus affect the overall color point of the LED filament.

According to some embodiments, the wavelength converting material may comprise at least two types of wavelength converting material.

The two types of wavelength converting material may be mixed together in the encapsulant. Embodiments comprising more than one type of wavelength converting material may provide a warmer LED filament light (i.e. with a lower CCT). Specifically, embodiments comprising more than one type of wavelength converting material may provide a warmer LED filament light with less intensity provided from the second type of LEDs and/or the third type of LEDs.

According to another aspect of the present disclosure, a LED filament arrangement is provided. The LED filament arrangement may comprise at least one LED filament as described in relation to any preceding embodiment and a controller. The controller may be configured to control the current to the LEDs of the first type, the current to the LEDs of the second type and the current to the LEDs of the third type.

By altering the powering (current supply) of the LEDs of the different types, the emission ratio between the different LED types may be changed. As the emission of light from the different types of LEDs (having different wavelengths) is varied, the color (and CCT) of the combined LED filament light may be varied. Thus, the controller may control the CCT of the LED filament light by controlling the power supply (current supply) to the LEDs of the different types.

Specifically, the controller may be configured to vary the current such that the color of the LED filament light (at least substantially) follows the BBL.

According to a further aspect of the present disclosure, a lighting device is provided. The lighting device may comprise a LED filament arrangement as described in relation to any one of the preceding embodiments. The lighting device may further comprise an at least partially light-transmissive envelope, enveloping the at least one LED filament of the LED filament arrangement. The lighting device may further comprise a base on which the envelope may be mounted. The base may be adapted for connecting to a luminaire socket.

The envelope may for example be translucent, such as transparent.

It is noted that other embodiments using all possible combinations of features recited in the above described embodiments may be envisaged. Thus, the present disclosure also relates to all possible combinations of features mentioned herein.

BRIEF DESCRIPTION OF DRAWINGS

Exemplifying embodiments will now be described in more detail with reference to the following appended drawings:

FIGS. 1 and 1a are schematic illustrations of a LED filament in accordance with some embodiments, FIG. 1 is a top-down view of the LED filament, and FIG. 1a is a side view of the LED filament;

As illustrated in the figures, the sizes of the elements and regions may be exaggerated for illustrative purposes and, thus, are provided to illustrate the general structures of the embodiments. Like reference numerals refer to like elements throughout.

DETAILED DESCRIPTION

Exemplifying embodiments will now be described more fully hereinafter with reference to the accompanying drawings, in which currently preferred embodiments are shown. The inventions may, however, be embodied in many different forms, and should not be construed as limited to the embodiments set forth herein; rather, these embodiments are provided for thoroughness and completeness, and fully convey the scope of the invention to the skilled person.

Figure 1:
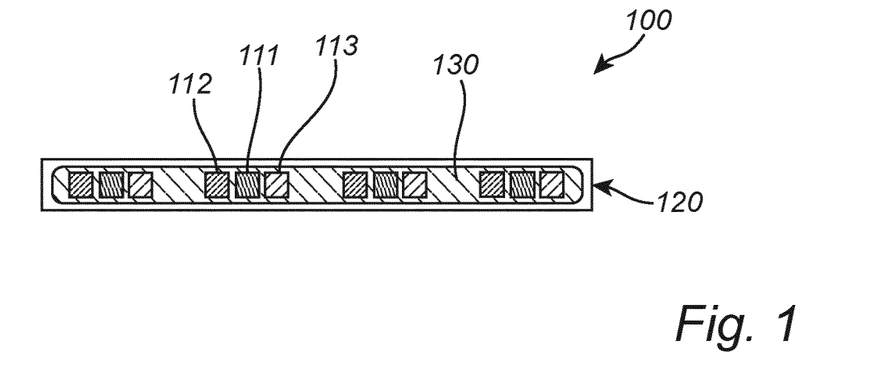
Figure 1A:
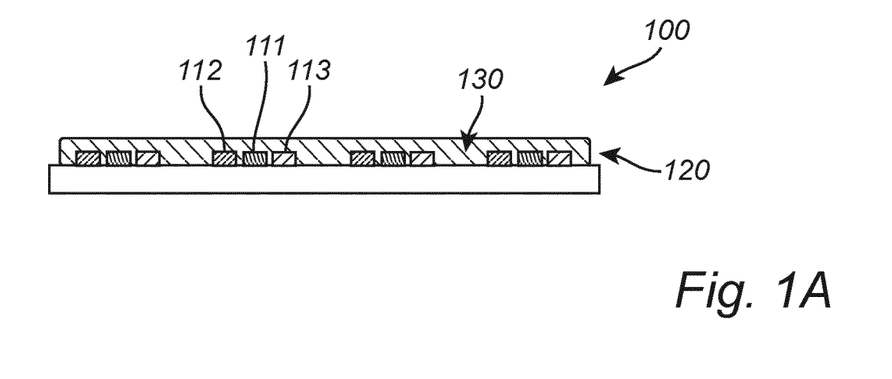

With reference to FIGS. 1 and 1a, a LED filament 100 in accordance with some embodiments will be described.

FIG. 1 is a top down (plan) view of the LED filament 100, while FIG. 1a is a side view of the LED filament 100. The LED filament 100 comprises a carrier 120 on which a plurality of LEDs 111, 112, 113 is arranged. In the present illustration, the plurality of LEDs comprises four LEDs 111 of a first type, four LEDs 112 of a second type, and four LEDs 113 of a third type.

The LEDs 111, 112, 113 are arranged in one row extending along the elongation of the carrier 120. Specifically, the row is one LED wide (as the LEDs 111, 112, 113 are aligned). It will be appreciated that other embodiments may comprise more or fewer LEDs, which may be arranged in one or more rows on the carrier.

The LEDs 111, 112, 113 are arranged in four groups of three LEDs each. The spacing between LEDs within a group is smaller than the spacing between two successive (adjacent) groups. Each group comprises one LED 111 of the first type, one LED 112 of the second type, and one LED 113 of the third type. The LEDs are further arranged such that every third LED in the row is a LED 111 of the first type, every third LED in the row is a LED 112 of the second type and every third LED is a LED 113 of the third type. In the present embodiment, the LED 111 of the first type of each group is arranged in the middle of the group. To the left of the LED 111 of the first type (as shown in the illustration) in each group, the LED 112 of the second type is arranged. The LED 113 of the third type is arranged to the right (as shown in the illustration) of the LED 111 of the first type.

The LED filament 100 further comprises an encapsulant 130. The encapsulant 130 encapsulates the row of LEDs and covers a portion of the carrier 120. It will be appreciated that in other embodiments, the encapsulant may encapsulate portions of the carrier. Alternatively, or additionally, the carrier and the LEDs may be embedded in the encapsulant.

It will be appreciated that in general a LED filament may provide LED filament light and comprise a plurality of light emitting diodes (LEDs) arranged in a linear array. Preferably, the LED filament may have a length L and a width W, wherein L>5 W. The LED filament may be arranged in a straight configuration or in a non-straight configuration such as for example a curved configuration, a 2D/3D spiral, or a helix. Preferably, the LEDs may be arranged on an elongated carrier like for instance a substrate, that may be rigid (made from e.g. a polymer, glass, quartz, metal, or sapphire) or flexible (e.g. made of a polymer or metal e.g. a film or foil).

In case the carrier comprises a first major surface and an opposite second major surface, the LEDs may be arranged on at least one of these surfaces. The carrier may be reflective or light transmissive, such as translucent and preferably transparent.

The LED filament may comprise an encapsulant at least partly covering at least part of the plurality of LEDs. The encapsulant may also at least partly cover at least one of the first major or second major surface. The encapsulant may be a polymer material which may be flexible such as for example a silicone. Further, the LEDs may be arranged for emitting LED light e.g. of different colors or spectrums. The encapsulant may comprise a luminescent material that is configured to at least partly convert LED light into converted light. The luminescent material may be a phosphor such as an inorganic phosphor and/or quantum dots or rods.

The LED filament may comprise multiple sub-filaments.

Figure 2:
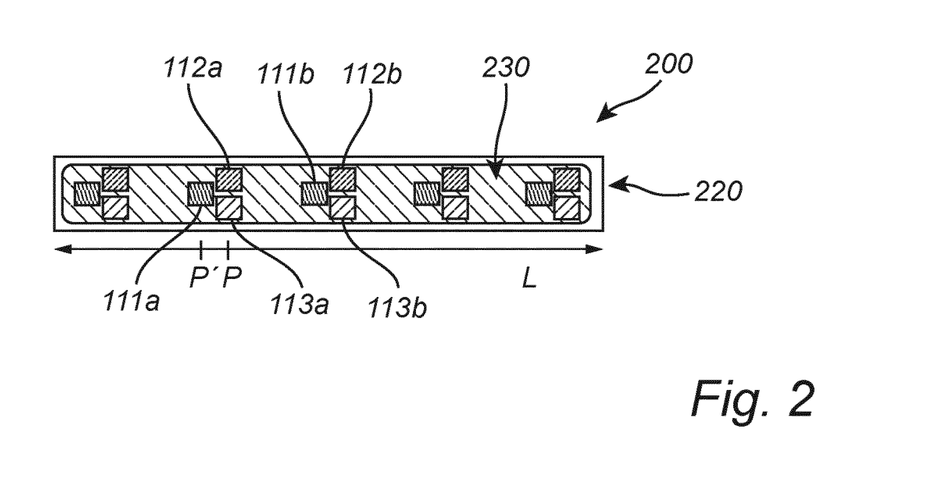
FIG. 2 is a schematic illustration of a LED filament in accordance with some embodiments.

With reference to FIG. 2, a LED filament 200 in accordance with some embodiments will be described.

FIG. 2 is a plan view of a LED filament 200. The LED filament 200 may be equivalent to the LED filament 100 described with reference to FIGS. 1 and 1a, except that the plurality of LEDs is arranged differently.

In the illustrated embodiment, the LEDs are arranged in groups of three LEDs. As in FIGS. 1 and 1a, each group comprises a LED 111a, 111b of the first type, a LED 112a, 112b of the second type, and a LED 113a, 113b of the third type.

Turning to a first group, the LED 112a of the second type is arranged at a same first position P along the elongation L of the carrier 220 as the LED 113a of the third type. At a second position P' along the elongation L of the carrier 220, next to (to the left of) the first position P, the LED 111a of the first type is arranged.

In a second group, the LEDs 111b, 112b, 113b are arranged in the same way as the first group, at a distance along the elongation of the carrier 220 from the first group. Specifically, the groups are all aligned along the elongation L of the carrier, such that the LEDs 111a, 111b of the first type of each group are aligned, the LEDs 112a, 112b of the second type of each group are aligned, and the LEDs 113a, 113b of the third type of each group are aligned. The encapsulant 230 encapsulates the row of groups of LEDs and covers a portion of the carrier 220.

As the LEDs 112a, 112b of the second type are arranged next to LEDs 113a, 113b of the third type the row formed by the groups of LEDs has a width corresponding to two LEDs separated by a small space. The substrate 220 and the encapsulant 230 are thus respectively wider than the substrate 120 and the encapsulant 130 described with reference to FIGS. 1 and 1a.

Figure 3:
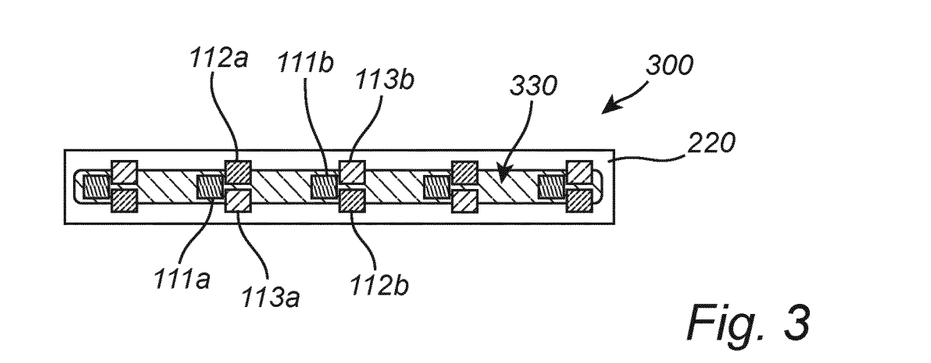
FIG. 3 is a schematic illustration of a LED filament in accordance with some embodiments.

With reference to FIG. 3, a LED filament 300 in accordance with some embodiments will be described.

FIG. 3 is a plan view of a LED filament 300. The LED filament 300 may be equivalent to the LED filament 200 described with reference to FIG. 2, except that the LEDs are arranged differently, and the encapsulant 330 is arranged as a thinner line.

The LEDs of the present embodiment are arranged in a similar manner as the LEDs of the LED filament 200 described with reference to FIG. 2. The LEDs 111a, 112a, 113a of the first group (and every second group) are arranged in the same way as described with reference to FIG. 2. However, in every other group, such as the second group, the LEDs 112b of the second type and the LEDs 113b of the third type have switched positions. In other words, referring to the position of the LED 111a of the first type in the first group as the first position, the position of the LED 112a of the second type in the first group as the second position and the position of the LED 113a of the third type in the first group as the third position, the LEDs in the second group (and every second group) are arranged as follows: the LED 111b of the first type is arranged in the first position, the LED 112b of the second type is arranged in the third position and the LED 113b of the third type is arranged in the second position. In other words, in every other group, the place of the LED 112a, 112b of the second type is interchanged with the place of the LED 113a, 113b of the third type.

Figure 4:
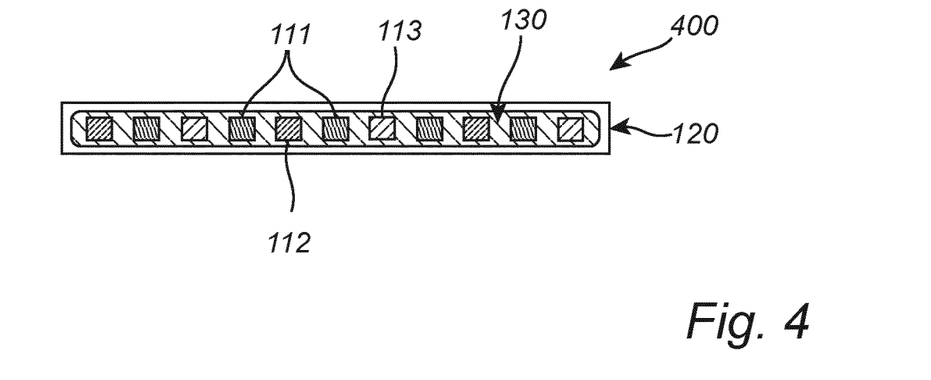
FIG. 4 is a schematic illustration of a LED filament in accordance with some embodiments.

With reference to FIG. 4, a LED filament 400 in accordance with some embodiments will be described.

The LED filament 400 may be equivalent to the LED filament 100 described with reference to FIG. 1, except that the LEDs 111, 112, 113 are arranged in a different manner.

The LEDs 111, 112, 113 are, as in FIG. 1, arranged in one row. In the present embodiment however, the LEDs 111, 112, 113 are not arranged in groups, rather, the space between each pair of successive LEDs is substantially equal.

Furthermore, the number of LEDs of one type is not equal to the number of LEDs of another type. The LED filament 400 comprises more LEDs 111 of the first type than LEDs of the second type (LED 112) and of the third type (LED 113). In the row of LEDs, every second LED is a LED 111 of the first type. Every fourth LED is a LED 112 of the second type and every fourth LED is a LED 113 of the third type. It will be appreciated that in some embodiments, the number of LEDs of the first type, the number of LEDs of the second type and the number of LEDs of the third type may be independently selected.

The LEDs of the first type 111 together with the wavelength converting material in the encapsulant 120 may form (cool) white light. The LEDs of the second type (LED 112) and the third type (LED 113) are used to shift the color point of the LED filament light towards warmer colors. There may thus not need to be as many LEDs 112, 113 of the second and third types as LEDs 111 of the first types.

Figure 5:
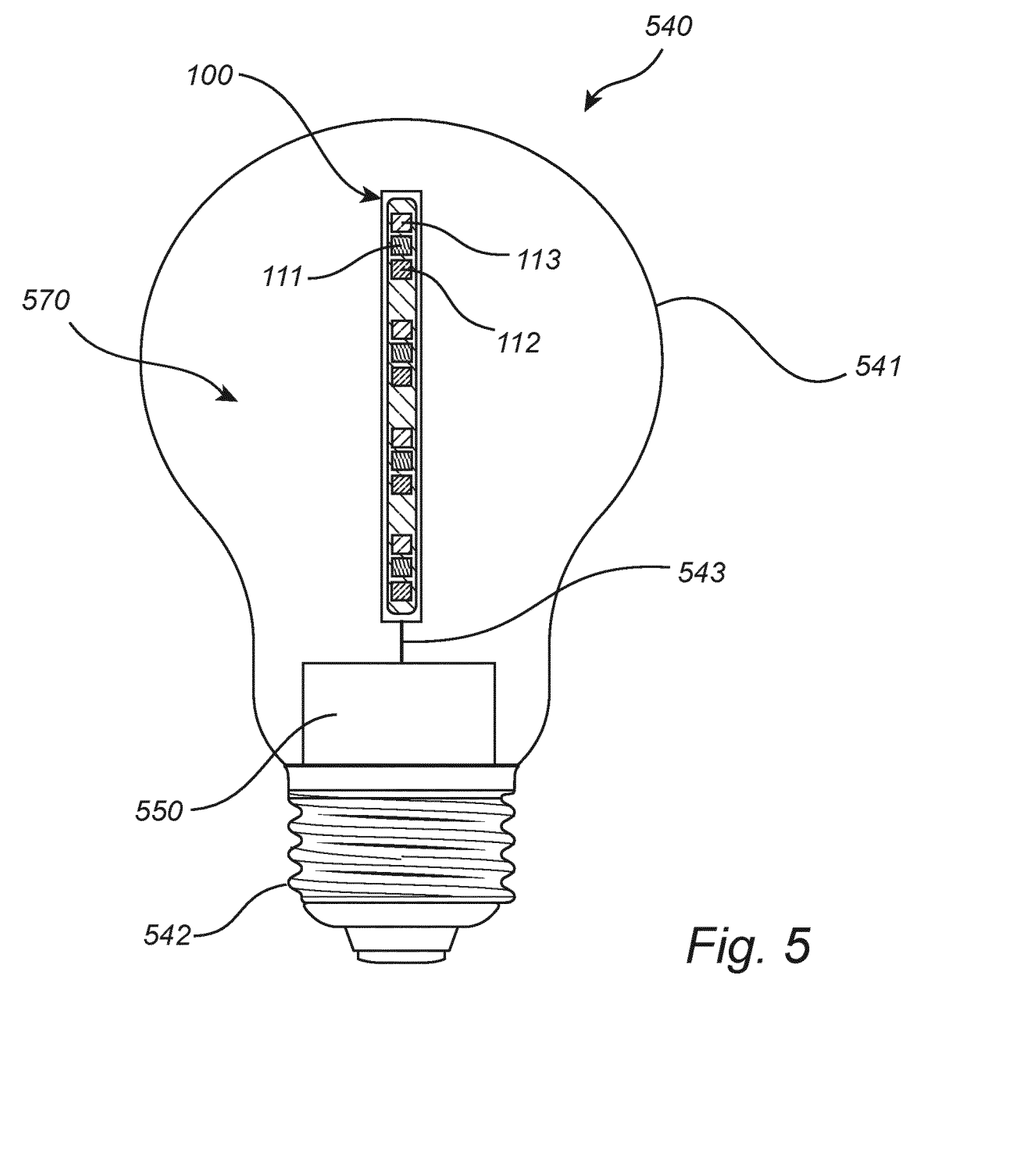
FIG. 5 is a schematic illustration of a lighting device in accordance with some embodiments.

With reference to FIG. 5, a lighting device 540, in accordance with some embodiments, will be described.

The lighting device 540 comprises a LED filament 100, which may be equivalent to the LED filament 100 as described with reference to FIG. 1. It will be appreciated that any other LED filament as described in any of the preceding embodiments may be used in a similar lighting device.

The lighting device further comprises a controller 550, which is connected to the LED filament 100 by means of a connector 543. The controller 559 may be configured to control the powering (current supply) of the LEDs 111 of the first type, the powering (current supply) of the LEDs 112 of the second type, and the powering (current supply) of the LEDs 113 of the third type. The LED filament 100 and the controller 550 together form a LED filament arrangement 570.

The lighting device 540 further comprises an envelope 541 which envelops the LED filament 100, and a base 542 on which the envelope 541 is mounted. The envelope 541 may be at least partially light-transmissive, such as translucent or transparent. In the present embodiment, the controller 550 is arranged on the base 542. In other embodiments, the controller may e.g. be arranged within the base.

The base 542 may further be adapted to be connected with a socket of a luminaire. In the present embodiment, the base 542 is for example adapted to be connected with an Edison socket.

Figure 6:
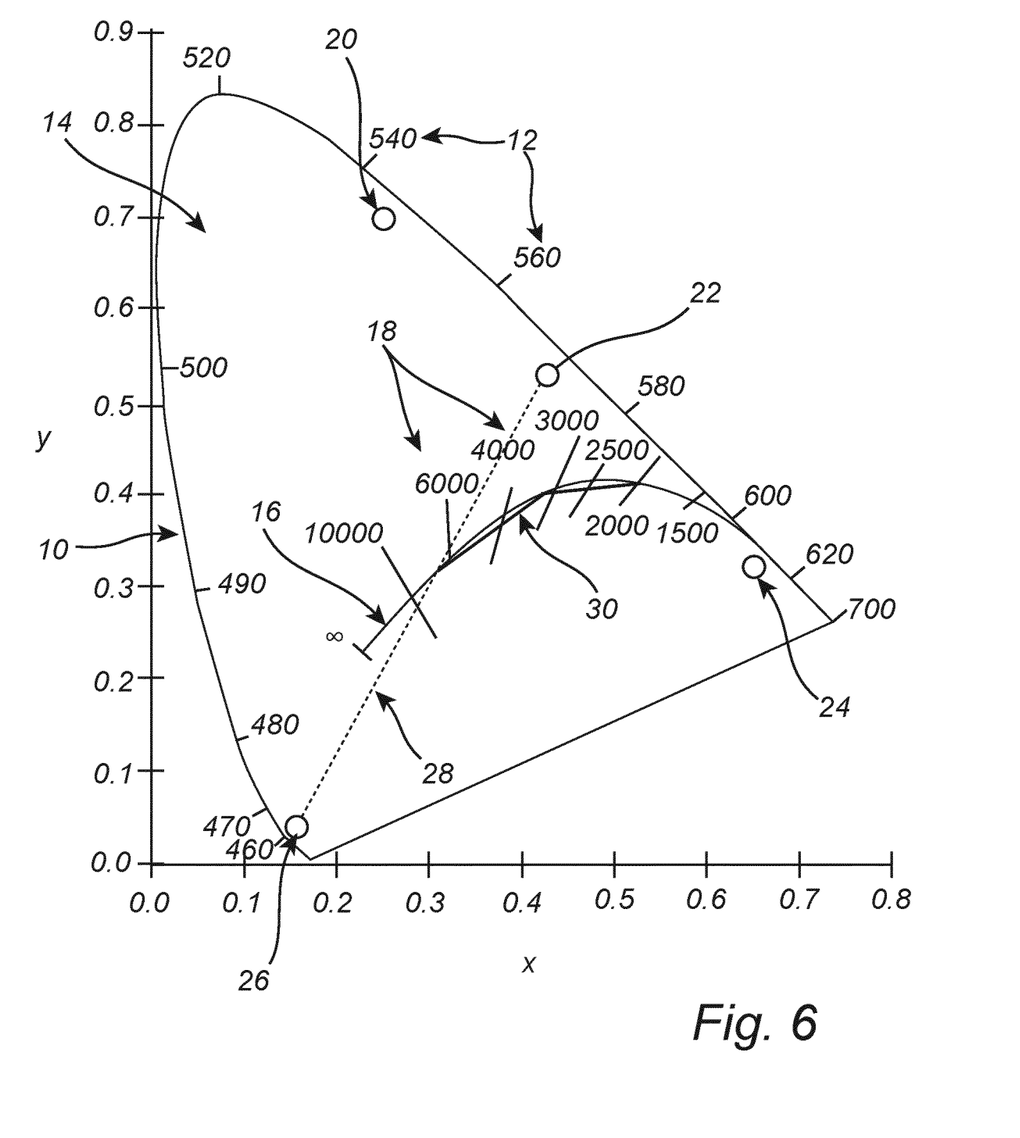
FIG. 6 is an illustration showing the black body locus in the CIE 1931 chromaticity diagram and a color variation range, in accordance with some embodiments.

With reference to FIG. 6, the idea of combining light of different wavelengths to form white light of different CCTs will be described.

FIG. 6 is an illustration of the CIE 1931 chromaticity diagram (or CIE 1931 color space), which links the distribution of wavelengths to perceived colors in human color vision. Different wavelengths 12 are marked in nanometers along a curved line 10 (the spectral locus) which defines a color space 14. In ideal color representations of this diagram, the space 14 defined by the spectral locus 10 presents all colors (or specifically chromaticities) visible to an average person. However, as FIG. 6 is a black-and-white representation of the diagram, only the contours are shown.

Further, in the color space 14, the black body locus (BBL) 16 is shown. It illustrates the different color light an ideal black body would emit when heated to certain temperatures 18. Lighting devices emitting light with colors along the BBL 16 may be considered to emit white light.

The CIE 1931 chromaticity diagram has the property that, if two points (e.g. points 22, 26) in the diagram are selected, all intermediate color points along the straight line (e.g. line 28) connecting the two points may be formed by mixing the two colors corresponding to the two points. If three points are selected, all colors within the triangle defined by the three points may be formed by mixing the three colors of the three points. As the BBL 16 is a curved line in the color space 14, more than two color points must be selected in order to be able to create the colors of the BBL along wider range of CCTs 18.

Specifically, using LEDs emitting light with a blue color 26, and an encapsulant comprising wavelength converting material which converts some of the blue 26 light to yellow 22 light, the ratio of the emission of these two types of light may be adapted such that the combined light is a white light with a CCT of e.g. 7000 K. Adding light with a red 24 color, and light with a green 20 color, the combined light may become warmer (i.e. with a lower CCT). For example, the light may be changed along a line 30 formed by straight segments down to a CCT of e.g. 2000 K without the intermediate colors being far from the BBL 16.

The LEDs emitting blue 26 light may be equivalent to the LEDs 111, 111a, 111b of the first type described with reference to any of FIGS. 1-4. For example, the LEDs emitting blue 26 light may emit light with a peak wavelength in the range 400-500 nm. The encapsulant comprising wavelength converting material converting blue 26 light to yellow 22 light may be equivalent to the encapsulant 130, 230,330 described above with reference to any of FIGS. 1-4. For example, the wavelength converting material may be adapted to emit light within an emission band at least including the wavelengths 500-650 nm. LEDs emitting green 20 light may be equivalent to any of the LEDs 112, 112a, 112b of the second type, described above with reference to any of FIGS. 1-4. For example, the green 20 LEDs may be adapted to emit light with a peak wavelength in the range 500-570 nm. Similarly, LEDs emitting red 24 light may be equivalent to any of the LEDs 113,113a, 113b of the third type described with reference to any of FIGS. 1-4. The red 24 LEDs may be adapted to emit light with a peak wavelength in the range 590-680 nm.

Figure 7:
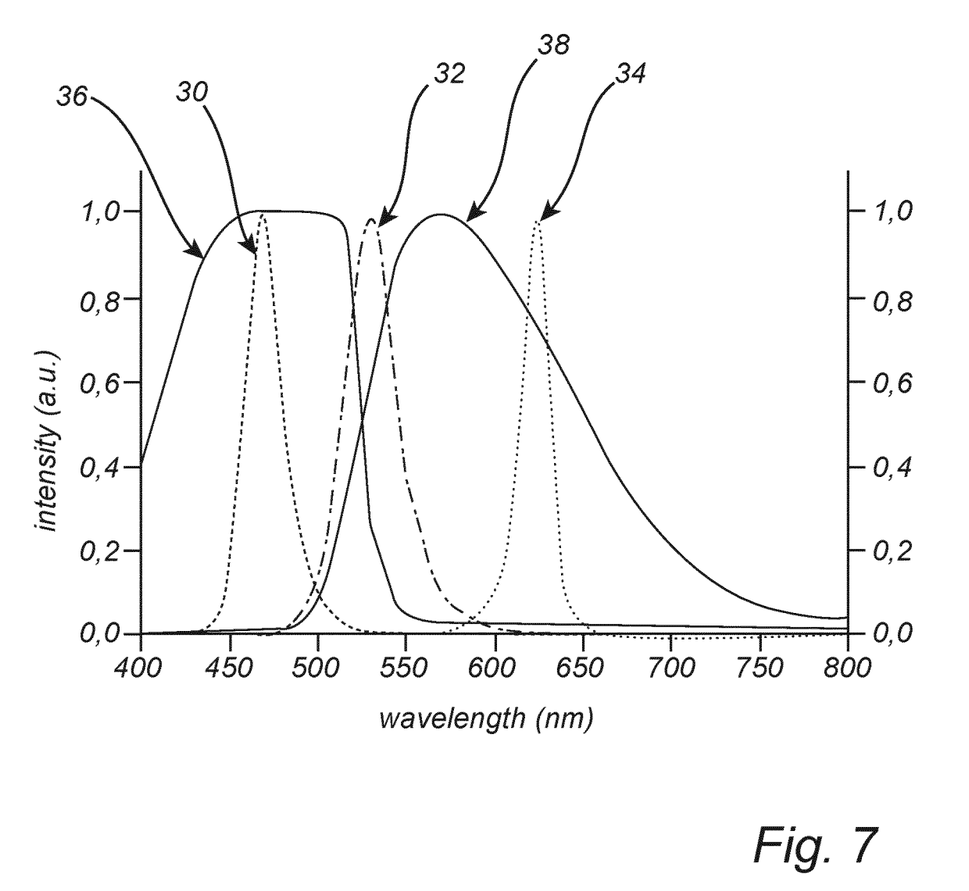
FIG. 7 is a wavelength-intensity diagram showing emission spectra for LEDs of different types and emission and absorption spectra for a wavelength converting material, in accordance with some embodiments.

With reference to FIG. 7, the absorption band of the wavelength converting material and light-emission of a LED filament in accordance with some embodiments will be described.

FIG. 7 is a wavelength-intensity diagram wherein wavelengths are shown along the primary axis (or X axis) in nanometers, and the intensity is shown along the secondary axis (or Y axis) in arbitrary (relative) units. Exemplary emission spectra are shown for blue LEDs 30, green LEDs 32, and red/amber LEDs 34. Exemplary absorption 36 and emission 38 spectra for a wavelength converting material are also illustrated.

The emission spectrum for the blue 30 LEDs has a peak wavelength in the range 400-500 nm. More specifically, the peak wavelength of the blue spectrum 30 is in the range 460-480 nm, such as approximately 470 nm. The blue spectrum 30 may be equivalent to spectra of the light emitted by any LEDs 111, 111a, 111b of the first type described above with reference to FIGS. 1-4.

The emission spectrum for the green 32 LEDs has a peak wavelength in the range 500-570 nm. More specifically, the peak wavelength of the green spectrum 32 is in the range 520-540 nm, such as approximately 530 nm. The green spectrum 32 may be equivalent to spectra of the light emitted by any LEDs 112, 112a, 112b of the second type described above with reference to FIGS. 1-4.

The emission spectrum for the red 34 LEDs has a peak wavelength in the range 590-680 nm. More specifically, the peak wavelength of the red spectrum 34 is in the range 620-640 nm, such as approximately 625 nm. The red spectrum 34 may be equivalent to spectra of the light emitted by any LEDs 113, 113a, 113b of the third type described above with reference to FIGS. 1-4.

The wavelength converting material has an absorption spectrum 36 covering an absorption band which includes the wavelengths 30 emitted by the blue LED. Thus, the wavelength converting material may absorb and convert light emitted by such blue LEDs.

The emission spectrum 32 of the green LEDs partially overlaps with the absorption spectrum 36 of the wavelength converting material. In other words, the light emitted by such green LEDs corresponds to wavelengths being at the fringe of the absorption band, and wavelengths being outside the absorption band. The wavelength converting material may thus absorb, and convert, a smaller portion of the green light. Light from the illustrated type of green LEDs is mostly transmitted.

The emission spectrum 34 of the red LEDs does not overlap with the absorption spectrum of the wavelength converting material. Thus, the light emitted by such red LEDs corresponds to wavelengths being outside the absorption band. Substantially all light emitted by such red LEDs is thus transmitted through such a wavelength converting material.

The emission spectrum 38 of the wavelength converting material illustrates the intensity of the (converted) light emitted by the wavelength converting material as a function of wavelength. The emission spectrum (and band) includes wavelengths in the range 500-650 nm. More specifically, it includes wavelengths in the range 460-750 nm. The wavelength converting material illustrated in the present embodiment is an yttrium aluminum garnet phosphor (YAG phosphor). It will, however, be appreciated that other wavelength converting materials may be used when implementing the embodiments of the present disclosure.

The light emitted by a LED filament employing LEDs emitting light with the spectra 30, 32, 34 in combination with a wavelength converting material emitting light with the spectrum 38, may comprise a combination of the spectra illustrated in FIG. 7. Such a combination may appear as white light. Varying the intensity of the light emitted by the different LEDs and converted by the wavelength converting material, may result in a varying color temperature (CCT) of the emitted light.

The person skilled in the art realizes that the present invention by no means is limited to the preferred embodiments described above. On the contrary, many modifications and variations are possible within the scope of the appended claims.

For example, though the LEDs are described to be arranged on a first side of the carrier, in other embodiments the LEDs may be arranged on more than one side of the carrier.

Although features and elements are described above in particular combinations, each feature or element can be used alone without the other features and elements or in various combinations with or without other features and elements.

Additionally, variations to the disclosed embodiments can be understood and effected by the skilled person in practicing the claimed invention, from a study of the drawings, the disclosure, and the appended claims. In the claims, the word "comprising" does not exclude other elements, and the indefinite article "a" or "an" does not exclude a plurality. The mere fact that certain features are recited in mutually different dependent claims does not indicate that a combination of these features cannot be used to advantage.

The invention claimed is:

1. A light-emitting diode, LED, filament comprising:
   a carrier (120), having a first side;
   a plurality of LEDs arranged on said first side, said plurality of LEDs comprising:
   at least one LED of a first type adapted to emit light having a first peak wavelength in the range 400 to 500 nm;
   at least one LED of a second type adapted to emit light having a second peak wavelength in the range 500 to 570 nm;
   at least one LED of a third type adapted to emit light having a third peak wavelength in the range 590 to 680 nm; and
   an encapsulant encapsulating at least the at least one LED of the first type, and at least partly encapsulating the LEDs of the second type and the third type;
   wherein said encapsulant comprises a wavelength converting material having a higher absorption coefficient for said first peak wavelength than for said second peak wavelength and said third peak wavelength;
   wherein said wavelength converting material has an emission band extending at least from 500 to 650 nm, and
   wherein said LED filament is adapted to emit light with at least a first correlated color temperature, CCT, based only on light emitted by the at least one LED of the first type; and
   said LED filament is adapted to emit light with at least a second CCT based on light emitted by the at least one LED of the first type, the at least one LED of the second type, and the at least one LED of the third type;
wherein a difference between the first CCT and the second CCT is in the range 3000-5300 K.

2. The LED filament of claim 1, wherein said first CCT is in the range 4000-7000 K.

3. The LED filament of claim 1, wherein light emitted by LEDs of the second type and by LEDs of the third type corresponds to wavelengths being outside or at the fringes of an absorption band within which said wavelength converting material is adapted to absorb light emitted by LEDs of the first type.

4. The LED filament of claim 1, wherein said plurality of LEDs are arranged in one row on the first side of the carrier.

5. The LED filament of claim 4, wherein in said row:
every third LED is a LED of the first type;
every third LED is a LED of the second type; and
every third LED is a LED of the third type.

6. The LED filament of claim 4, wherein said LEDs are arranged in groups of three in said row; wherein a LED spacing between LEDs within each group is shorter than a group spacing between two successive groups.

7. The LED filament of claim 1, wherein said plurality of LEDs is arranged in groups of three LEDs, each group comprising:
one LED of said at least one LED of the first type;
one LED of said at least one LED of the second type;
one LED of said at least one LED of the third type;
wherein
the LED of the second type and the LED of the third type are arranged at a substantially same position along the elongation of the carrier;
the LED of the first type is arranged at a different position along the elongation of the carrier, next to the position of the LED of the second type and the LED of the third type; and
wherein LEDs of the first type of each group are aligned along the elongation of the carrier.

8. The LED filament of claim 7, wherein the LEDs of the second type of each group are aligned along said elongation of the carrier, and wherein the LEDs of the third type of each group are aligned along said elongation of the carrier.

9. The LED filament of claim 7, wherein said encapsulant is arranged in one line covering the LEDs of the first type, and partially covering the LEDs of the second type and the third type.

10. The LED filament of claim 1, wherein said encapsulant is arranged in a line covering the LEDs of the first type, the LEDs of the second type and the LEDs of the third type.

11. The LED filament of claim 1, wherein said plurality of LEDs comprises more LEDs of the first type than LEDs of the second type and LEDs of the third type.

12. The LED filament of claim 1, wherein said wavelength converting material comprises at least two types of wavelength converting material.

13. A LED filament arrangement comprising:
at least one LED filament as defined in claim 1; and
a controller configured to control the current to the LEDs of the first type, the current to the LEDs of the second type and the current to the LEDs of the third type.

14. A lighting device comprising:
a LED filament arrangement as defined in claim 13;
an at least partially light-transmissive envelope, enveloping said at least one LED filament of said LED filament arrangement;
a base on which said envelope is mounted, said base being adapted for connecting to a luminaire socket.

* * * * *